United States Patent
DeCook et al.

(10) Patent No.: US 7,977,877 B2
(45) Date of Patent: Jul. 12, 2011

(54) FLAT PANEL OLED DEVICE HAVING DEFORMABLE SUBSTRATE

(75) Inventors: Bradley C. DeCook, Rochester, NY (US); James Mazzarella, Fairport, NY (US); Roger G. Covington, Rochester, NY (US); Thomas W. Palone, Rochester, NY (US); Michael L. Boroson, Rochester, NY (US); Michele L. Ricks, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 934 days.

(21) Appl. No.: 11/681,203

(22) Filed: Mar. 2, 2007

(65) Prior Publication Data

US 2008/0211402 A1   Sep. 4, 2008

(51) Int. Cl.
*H01J 1/62* (2006.01)

(52) U.S. Cl. .......... 313/512; 313/511; 313/11; 313/25; 313/45

(58) Field of Classification Search .......... 313/512, 313/511, 11, 25, 45
See application file for complete search history.

(56) References Cited

U.S. PATENT DOCUMENTS

| | | | |
|---|---|---|---|
| 4,910,434 A * | 3/1990 | Doumani et al. ............... | 313/11 |
| 5,821,692 A | 10/1998 | Rogers et al. | |
| 5,990,615 A | 11/1999 | Sakaguchi et al. | |
| 6,150,187 A * | 11/2000 | Zyung et al. ............ | 438/26 |
| 6,259,204 B1 * | 7/2001 | Ebisawa et al. ............... | 313/512 |
| 6,633,123 B2 * | 10/2003 | Tazawa .................... | 313/506 |
| 6,660,547 B2 | 12/2003 | Guenther | |
| 6,688,933 B1 | 2/2004 | Heimgartner | |
| 6,967,439 B2 * | 11/2005 | Cok et al. ..................... | 313/512 |
| 7,026,758 B2 | 4/2006 | Guenther et al. | |
| 7,049,745 B2 * | 5/2006 | Cok ............................... | 313/512 |
| 7,063,902 B2 | 6/2006 | Kikuchi et al. | |
| 7,109,520 B2 * | 9/2006 | Yu et al. ............................ | 257/40 |
| 7,135,357 B2 * | 11/2006 | Yu et al. ....................... | 438/122 |
| 7,358,665 B2 * | 4/2008 | Yu et al. ....................... | 313/512 |
| 2002/0067126 A1 * | 6/2002 | Van Den Reek et al. ..... | 313/512 |
| 2005/0062399 A1 * | 3/2005 | Gotoh et al. .................. | 313/491 |
| 2005/0117293 A1 | 6/2005 | Yokoyama | |
| 2006/0290251 A1 * | 12/2006 | Shives et al. ................... | 313/46 |
| 2008/0211402 A1 * | 9/2008 | DeCook et al. ............... | 313/511 |
| 2008/0265753 A1 * | 10/2008 | Ricks et al. .................... | 313/504 |

FOREIGN PATENT DOCUMENTS

| | | |
|---|---|---|
| JP | 10-275681 | 10/1998 |
| JP | 2006-85920 | 3/2006 |

* cited by examiner

*Primary Examiner* — Peter Macchiarolo

(74) *Attorney, Agent, or Firm* — Morgan, Lewis & Bockius LLP

(57) ABSTRACT

A flat panel OLED device including a transparent deformable substrate having first and second sides and defining a predetermined illumination region and a non-illumination region; a moisture-sensitive OLED disposed over the first side of the transparent substrate within the illumination region and means for applying electrical signals to the OLED which causes the OLED to produce light and heat; a protective layer disposed over the OLED; a flexible encapsulating foil disposed over the protective layer, but not attached thereto; and a rigid chassis structure operatively associated with the transparent deformable substrate for dissipating the heat and providing rigidity to the transparent deformable substrate.

18 Claims, 3 Drawing Sheets

FLAT PANEL OLED DEVICE HAVING DEFORMABLE SUBSTRATE

CROSS REFERENCE TO RELATED APPLICATION

Reference is made to commonly assigned U.S. patent application Ser. No. 11/681,202, filed concurrently herewith by Bradley C. DeCook et al., entitled "Flat Panel OLED Device Having Deformable Substrate," the disclosure of which is incorporated herein.

FIELD OF THE INVENTION

The present invention relates to flat panel OLED devices and more particularly to structures for providing rigidity to such devices and for protecting them from moisture damage.

BACKGROUND OF THE INVENTION

Organic light-emitting diode (OLED) devices initially found acceptance as relatively small display devices. Typically OLED devices have a hole-transporting layer and electron-transporting layer disposed on either side of a organic light-emitting layer. Spaced electrodes cause current to pass through the OLED, and the combination of holes and electrons in the organic light-emitting layer produces light. These OLED devices typically have either a passive-matrix or active-matrix drive format. Flat-panel devices, such as television displays, presentation displays, or light-emitting panels, are becoming more popular. Flat-panel OLED devices offer a number of advantages for these applications. However, there are problems associated with flat-panel OLED devices. To reduce weight, OLED devices typically use a thin, deformable substrate that can bend, fracture, or break, thereby distorting the light output. Another difficulty is that if the substrate is thin, the OLED can produce enough heat to distort the substrate.

Various methods have been used to provide support for OLED devices. Guenther, in U.S. Pat. No. 6,660,547, discloses a support rim for electroluminescent devices. Heimgartner, in U.S. Pat. No. 6,688,933, teaches the use of a structural frame for electroluminescent devices. Guenther et al., in U.S. Pat. No. 7,026,758, disclose a stiff reinforcement lid for an electroluminescent device, wherein the lid serves to support the device. In none of these cases, however, is any provision made for removing heat.

Kikuchi et al., in U.S. Pat. No. 7,063,902, teach an OLED that has been encapsulated with a filler layer that is heat-conductive. However, there is no indication of how to provide such a heat-conductive layer with support. In JP 10-275681, there is shown a protecting layer with a metal filler and carbon powder to provide high heat conductance.

It is thus a problem to be solved to provide both structural support and heat dissipation to an electroluminescent device.

SUMMARY OF THE INVENTION

It is therefore an object of the present invention to provide a flat panel OLED device that provides rigidity to the transparent deformable substrate and that also provides moisture and heat protection for the OLED in the flat panel device.

This object is achieved by a flat panel OLED device comprising:

(a) a transparent deformable substrate having first and second sides and defining a predetermined illumination region and a non-illumination region;

(b) a moisture-sensitive OLED disposed over the first side of the transparent substrate within the illumination region and means for applying electrical signals to the OLED which causes the OLED to produce light and heat;

(c) a protective layer disposed over the OLED;

(d) a flexible encapsulating foil disposed over the protective layer, but not attached thereto; and (e) a rigid chassis structure operatively associated with the transparent deformable substrate for dissipating the heat and providing rigidity to the transparent deformable substrate.

It is an advantage of this invention that it provides for heat distribution and reduces the risk of overheating and heat-distortion of an OLED device, and greatly reduces the risk of image burn-in. It is a further advantage of this invention that it also provides structural support for an OLED device, providing excellent rigidity for large pieces of OLED glass, and can provide a robust mounting structure.

DETAILED DESCRIPTION OF THE INVENTION

The term "OLED display", or "organic light-emitting display" is used in its art-recognized meaning of a display device comprising organic light-emitting diodes as pixels. The term "OLED device" refers to a light-emitting device comprising organic light-emitting diodes, but is not limited to a display device, e.g. "OLED device" can include illuminating panels. The term "multicolor" is employed to describe a display panel that is capable of emitting light of a different hue in different areas. In particular, it is employed to describe a display panel that is capable of displaying images of different colors. These areas are not necessarily contiguous. The term "full color" is commonly employed to describe multicolor display panels that are capable of emitting in at least the red, green, and blue regions of the visible spectrum and displaying images in any combination of hues. The complete set of colors that can be generated by a given display is commonly called the color gamut of the display. The red, green, and blue colors constitute the three primary colors from which all other colors can be generated by appropriate mixing. However, the use of additional colors to extend the color gamut or within the color gamut of the device is possible. The term "hue" refers to the intensity profile of light emission within the visible spectrum, with different hues exhibiting visually discernible differences in color. The term "pixel" is employed in its art-recognized usage to designate an area of a display panel that can be stimulated to emit light independently of other areas.

Figure 1:
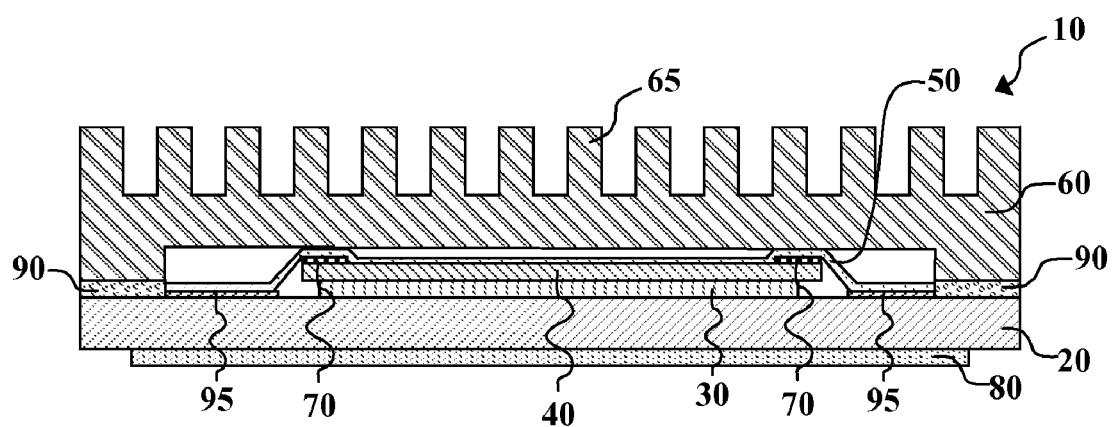
FIG. 1 shows a cross-sectional view of a first embodiment of a flat-panel OLED device with a rigid chassis structure according to this invention.

Turning now to FIG. 1, there is shown a cross-sectional view of a first embodiment of a flat-panel OLED device 10 with a rigid chassis structure according to this invention. OLED device 10 includes a substrate 20, which is a transparent deformable substrate through which light is emitted. OLED device 10 is thus of the type commonly known as a bottom-emitting OLED. OLED device 10 can be a flat panel OLED display, e.g. an OLED device that can display images in one or more colors, including a full-color display. Such a display can include an array of addressable OLED pixels as well-known in the art. The array of pixels can be a passive-matrix array or an active-matrix array. In the case of an active-matrix array, an array of electronic control elements, e.g. thin-film transistors (TFTs) can be patterned onto substrate 20 for controlling the emission intensity of individual pixels. Alternatively, OLED device 10 can be an illuminating device, e.g. a lighting panel. A moisture-sensitive OLED 30 as well-known in the art is disposed over the first side of transparent substrate 20. In the embodiment wherein OLED device 10 is an OLED display, OLED 30 includes an array of moisture-sensitive, addressable OLED pixels as well-known in the art. OLED device 10 includes an illumination region and a non-illumination region. In the most basic embodiment, the illumination region is defined by OLED 30 or a portion thereof, while the area on substrate 20 surrounding OLED 30 defines the non-illumination region. It will be understood that other embodiments are possible; for example, an OLED device can have multiple non-contiguous illumination regions separated by non-illumination regions. In the embodiment wherein OLED device 10 is an OLED display, the illumination and non-illumination regions are commonly known as the display and non-display regions, respectively. OLED device 10 also includes electrical conductors connected to a power source for applying electrical signals to OLED 30, which causes the OLED to produce light, and also thereby produces unwanted heat.

A protective layer 40, which is desirably electrically insulating, is disposed over OLED 30. Protective layer 40 protects OLED 30 from electrical short-circuits and from physical damage from contact, e.g. rubbing, due to a conductive foil layer disposed over it, as described below. Some examples of materials for protective layer 40 include a polymer, and an oxide layer, e.g. $SiO_x$. Protective layer 40 can be from 0.5 to 25 microns thick. Protective layer 40 extends past the edge of OLED 30 based upon normal manufacturing tolerances, so as to completely cover the cathode of OLED 30.

OLED device 10 further includes a flexible encapsulating foil 50. Foil 50 is disposed over protective layer 40, but is not attached thereto. Foil 50 is sealingly connected to the non-illumination region of substrate 20 with an adhesive 95 at or near the edge of the foil 50, thus creating a seal enclosing OLED 30. Adhesive 95 has a low permeability to moisture, and typically is provided with a width of 0.5 to 15 mm and a thickness of 5 to 50 microns. A desiccant layer 70 can further be placed over the periphery of protective layer 40 and between protective layer 40 and foil 50. Some non-limiting examples of desiccants include alumina, bauxite, calcium sulfate, clays, silica gel, zeolites, alkaline metal oxides, alkaline earth oxides, sulfates, metal halides, and perchlorates. Foil 50 is usefully a metal foil, such as aluminum foil.

OLED device 10 further includes rigid chassis structure 60 that is operatively associated with substrate 20 via connection by means of a structural adhesive 90 in the non-illumination region of substrate 20. Adhesive 90 can be a structural foam tape or a dispensable adhesive. It is desirable to have adhesive 90 around the entire perimeter of chassis structure 60, but gaps can be left as needed for wire access, etc. Chassis structure 60 is a closed frame structure that provides rigidity and support to substrate 20 and dissipates heat from OLED 30. Rigid chassis structure 60 is spaced from foil 50 in the illumination region such that chassis structure 60 does not touch foil 50 while maintaining a display as thin as possible, e.g. a 5 mm gap. Chassis structure 60 is formed from a material that provides rigidity, is lightweight, and is a good conductor of heat from OLED 30, e.g. a metal such as aluminum. The closed structure of chassis structure 60 allows a large portion of the surface of the chassis structure 60 to dissipate heat from OLED 30. Additional cross-braces 65 formed into the top of the chassis structure 60 provide additional rigidity as well as act as a finned heat sink to enhance thermal dissipation. The structure can be combined with external fan cooling to further enhance thermal dissipation. Chassis structure 60 can be formed using any of a variety of methods well-known for making such structures, so that chassis structure 60 can be e.g. an aluminum cast structure.

OLED device 10 can also include a transparent plastic sheet 80 sealingly attached to the second side of substrate 20, e.g. by adhesive in the non-illumination region of substrate 20. Such sheet 80 can be optically functional, e.g. a polarizing sheet. This sheet 80 can also provide added protection against damage to substrate 20.

Figure 2:
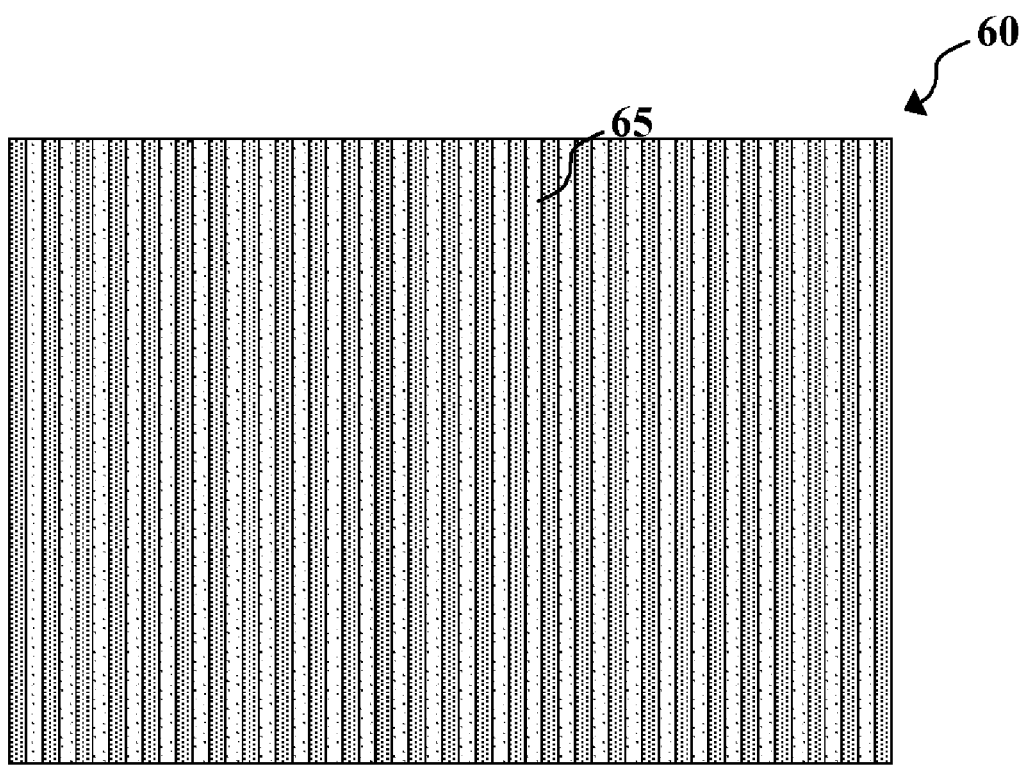
FIG. 2 shows a top view of the rigid chassis structure of FIG. 1.

Turning now to FIG. 2, there is shown a top view of the rigid chassis structure 60 of FIG. 1. FIG. 2 shows the closed frame structure 60 of chassis structure 60. Cross-braces 65 formed into the body of the chassis structure provide additional support and rigidity to the chassis structure, as well as an added surface for dissipating heat.

In a preferred embodiment, the invention is employed in a display that includes Organic Light Emitting Diodes (OLEDs) which are composed of small molecule or polymeric OLEDs as disclosed in but not limited to U.S. Pat. No. 4,769,292, by Tang et al., and U.S. Pat. No. 5,061,569, by VanSlyke et al. Many combinations and variations of organic light emitting displays can be used to fabricate such a display.
General Display Architecture The present invention can be employed in most bottom-emitting OLED display configurations. These include very simple structures including a single anode and cathode to more complex displays, such as passive matrix displays comprised of orthogonal arrays of anodes and cathodes to form light emitting elements, and active-matrix displays where each light emitting element is controlled independently, for example, with thin film transistors (TFTs).

Figure 3:
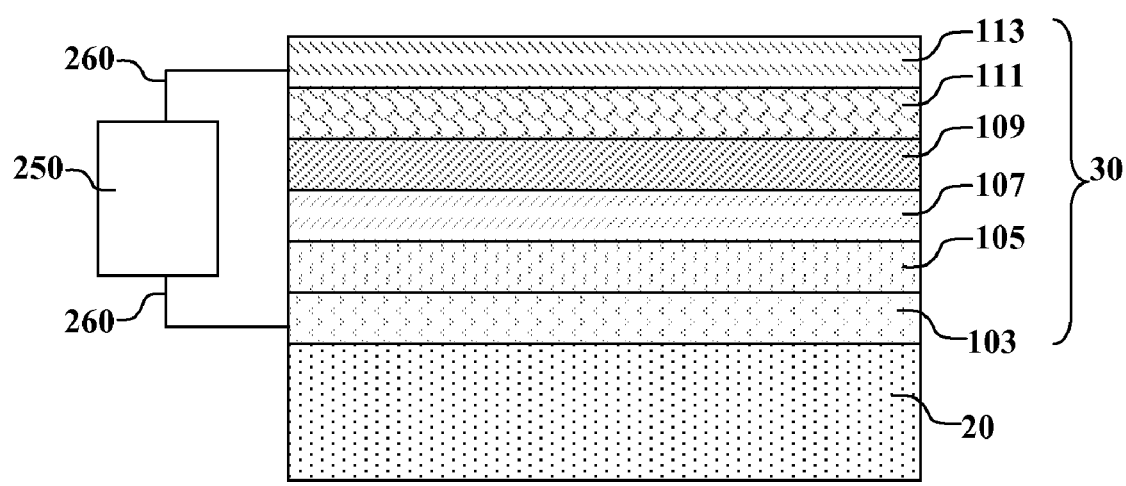
FIG. 3 shows a cross-sectional diagram representing the structure of a prior-art OLED that is useful with the present invention.

There are numerous configurations of the organic layers wherein the present invention can be successfully practiced. A cross-sectional view of a typical prior art structure useful with the present invention is OLED 30, which is shown in FIG. 3 and includes an anode 103, a hole-injecting layer 105, a hole-transporting layer 107, a light-emitting layer 109, an electron-transporting layer 111, and a cathode 113 on substrate 20. These layers are described in detail below. Note that the cathode 113 can alternatively be located adjacent to the substrate 20, or the substrate 20 can actually constitute the anode 103 or cathode 113. The organic layers between the anode 103 and cathode 113 are conveniently referred to as the organic EL element. The total combined thickness of the organic layers is preferably less than 500 nm.

Anode 103 and cathode 113 of OLED 30 are connected to a power source 250 through electrical conductors 260 so as to apply electrical signals to OLED 30 to produce light. The OLED is operated by applying a potential between the anode 103 and cathode 113 such that the anode 103 is at a more positive potential than the cathode 113. Holes are injected into the organic EL element from the anode 103 and electrons are injected into the organic EL element at the cathode 113. Enhanced display stability can sometimes be achieved when the OLED is operated in an AC mode where, for some time period in the cycle, the potential bias is reversed and no current flows. An example of an AC-driven OLED is described in U.S. Pat. No. 5,552,678.
Substrate The OLED display of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can be any transmissive material including, but not limited to, glass and plastic. The substrate is deformable, by which it is meant that it is not rigid and provides no structural benefit, e.g. glass of 1 mm thickness or less.

Anode

Anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. Typical anode materials have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes can be polished prior to application of other layers to reduce surface roughness so as to minimize shorts or enhance reflectivity.

Hole-Injecting Layer (HIL)

While not always necessary, it is often useful to provide a hole-injecting layer 105 between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL displays are described in EP 0 891 121 A1 and EP 1 029 909 A1.

Hole-Transporting Layer (HTL)

Hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis [N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, light-emitting layer (LEL) 109 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant can be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the triplet energy level of the host be high enough to enable energy transfer from host to dopant.

Host and emitting molecules known to be of use include, but are not limited to, those disclosed in U.S. Pat. Nos. 4,768, 292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo{f}-8-quinolinolato]zinc (II)
CO-4: Bis(2-methyl-8-quinolinolato)aluminum(III)-p-oxo-bis(2-methyl-8-quinolinolato)aluminum(III)
CO-5: Indium trisoxine [alias, tris(8-quinolinolato)indium]
CO-6: Aluminum tris(5-methyloxine)[alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato) gallium (III)]
CO-9: Zirconium oxine [alias, tetra(8-quinolinolato)zirconium(IV)]

Other classes of useful host materials include, but are not limited to: derivatives of anthracene, such as 9,10-di-(2-naphthyl) anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl) methane compounds, and carbostyryl compounds.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed above.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Cathode

As light emission is viewed through anode 103 and substrate 20, the cathode 113 can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

Cathode materials are typically deposited by evaporation, sputtering, or chemical vapor deposition. When needed, patterning can be achieved through many well known methods including, but not limited to, through-mask deposition, integral shadow masking, for example, as described in U.S. Pat. No. 5,276,380 and EP 0 732 868, laser ablation, and selective chemical vapor deposition.

Other Common Organic Layers and Display Architecture

In some instances, layers 109 and 111 can optionally be collapsed into a single layer that serves the function of supporting both light emission and electron transportation. It also known in the art that light-emitting dopants can be added to the hole-transporting layer, which can serve as a host. Multiple dopants can be added to one or more layers in order to create a white-emitting OLED, for example, by combining blue- and yellow-emitting materials, cyan- and red-emitting materials, or red-, green-, and blue-emitting materials. White-emitting displays are described, for example, in EP 1 187 235, U.S. Patent Application Publication No. 2002/0025419, EP 1 182 244, U.S. Pat. No. 5,683,823, U.S. Pat. No. 5,503,910, U.S. Pat. No. 5,405,709, and U.S. Pat. No. 5,283,182.

Additional layers such as electron- or hole-blocking layers as taught in the art can be employed in displays of this invention. Hole-blocking layers are commonly used to improve efficiency of phosphorescent emitter displays, for example, as in U.S. Patent Application Publication No. 2002/0015859.

This invention can be used in so-called stacked display architecture, for example, as taught in U.S. Pat. No. 5,703,436 and U.S. Pat. No. 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats, or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet methods (U.S. Pat. No. 6,066,357).

Optical Optimization

OLED displays of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display.

The invention has been described in detail with particular reference to certain preferred embodiments thereof, but it will be understood that variations and modifications can be effected within the spirit and scope of the invention.

PARTS LIST

10 OLED device
20 substrate
30 OLED
40 protective layer
50 foil
60 chassis structure
65 cross-brace
70 desiccant layer
80 plastic sheet
90 adhesive
95 adhesive
103 anode
105 hole-injecting layer
107 hole-transporting layer
109 light-emitting layer
111 electron-transporting layer
113 cathode
250 power source
260 electrical conductors

The invention claimed is:

1. An OLED device comprising:
    (a) a transparent deformable substrate having first and second sides and defining a predetermined illumination region and a non-illumination region
    (b) a moisture-sensitive OLED disposed over the first side of the transparent substrate within the illumination region and means for applying electrical signals to the OLED which causes the OLED to produce light and heat;
    (c) a protective layer disposed over the OLED;
    (d) a flexible encapsulating foil disposed over the protective layer, but not attached thereto; and
    (e) a rigid chassis structure operatively associated with the transparent deformable substrate for reducing the risk of heat-distortion of the OLED device and/or image burn-in and providing rigidity to the transparent deformable substrate.

2. The OLED device of claim 1 wherein the protective layer comprises a polymeric material.

3. The OLED device of claim 1 further including a desiccant layer over the periphery of the protective layer.

4. The OLED device of claim 1 wherein the flexible encapsulating foil is metal foil.

5. The OLED device of claim 1 wherein the rigid chassis structure is a closed frame structure.

6. The OLED device of claim 5 wherein the rigid chassis structure comprises an aluminum cast structure.

7. The OLED device of claim 1 further including:
    (f) a transparent optically functional plastic sheet sealingly attached to the second side of the substrate.

8. The OLED device of claim 1 wherein the OLED device is a bottom-emitting device.

9. The OLED device of claim 1 wherein the chassis structure includes cross-braces that act as a finned heat sink.

10. An OLED display comprising:
    (a) a transparent deformable substrate having first and second sides and defining a predetermined display region and a non-display region;
    (b) an array of moisture-sensitive, addressable OLED pixels disposed over the first side of the transparent substrate within the display region and means for applying electrical signals to the display pixels to produce light and heat;
    (c) a protective layer disposed over the array of OLED pixels;
    (d) a flexible encapsulating foil disposed over the protective layer, but not attached thereto, and sealingly connected to the substrate in the non-display region; and
    (e) a rigid chassis structure connected to the substrate in the non-display region for reducing the risk of heat-distortion of the OLED display and/or image burn-in and providing rigidity to the transparent deformable substrate, and the rigid chassis structure being spaced from the foil in the display region.

11. The OLED display of claim 10 wherein the protective layer comprises a polymeric material.

12. The OLED display of claim 10 further including a desiccant layer over the periphery of the protective layer.

13. The OLED display of claim 10 wherein the flexible encapsulating foil is metal foil.

14. The OLED display of claim 10 wherein the rigid chassis structure is a closed frame structure.

15. The OLED display of claim 14 wherein the rigid chassis structure comprises an aluminum cast structure.

16. The OLED display of claim 10 further including:
    (f) a transparent optically functional plastic sheet sealingly attached to the second side of the substrate.

17. The OLED display of claim 10 wherein the OLED display is a bottom-emitting display.

18. The OLED display of claim 10 wherein the chassis structure includes cross-braces that act as a finned heat sink.

* * * * *